United States Patent
Savariar-Hauck et al.

(10) Patent No.: US 9,229,325 B2
(45) Date of Patent: *Jan. 5, 2016

(54) METHOD FOR MAKING LITHOGRAPHIC PRINTING PLATES

(71) Applicant: Eastman Kodak Company, Rochester, NY (US)

(72) Inventors: Celin Savariar-Hauck, Badenhausen (DE); Gerhard Hauck, Badenhausen (DE); Domenico Balbinot, Osterode (DE); Andrea Pauls, Osterode (DE)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/189,055

(22) Filed: Feb. 25, 2014

(65) Prior Publication Data

US 2015/0241777 A1   Aug. 27, 2015

(51) Int. Cl.
*G03F 7/00* (2006.01)
*G03F 7/20* (2006.01)

(52) U.S. Cl.
CPC .................................. *G03F 7/20* (2013.01)

(58) Field of Classification Search
CPC .......................... B41C 2210/02; G03F 7/322
USPC ....................................................... 430/302
See application file for complete search history.

(56) References Cited

U.S. PATENT DOCUMENTS

| | | | |
|---|---|---|---|
| 6,162,575 A * | 12/2000 | Fujioka et al. | 430/204 |
| 6,541,181 B1 | 4/2003 | Levanon et al. | |
| 7,399,576 B1 | 7/2008 | Levanon | |
| 7,544,462 B2 | 6/2009 | Levanon et al. | |
| 8,043,787 B2 | 10/2011 | Hauck et al. | |
| 8,383,319 B2 | 2/2013 | Huang et al. | |
| 8,530,141 B2 | 9/2013 | Savariar-Hauck et al. | |
| 8,530,143 B2 | 9/2013 | Levanon et al. | |
| 2004/0063036 A1 | 4/2004 | Takamiya | |
| 2006/0154187 A1 | 7/2006 | Wilson et al. | |
| 2009/0162783 A1 | 6/2009 | Levanon et al. | |
| 2009/0202948 A1 * | 8/2009 | Simpson et al. | 430/302 |
| 2011/0097666 A1 | 4/2011 | Savariar-Hauck et al. | |
| 2012/0125216 A1 | 5/2012 | Levanon et al. | |
| 2012/0129095 A1 * | 5/2012 | Levanon et al. | 430/270.1 |

* cited by examiner

*Primary Examiner* — Chanceity Robinson
(74) *Attorney, Agent, or Firm* — J. Lanny Tucker

(57) ABSTRACT

Lithographic printing plate are formed by imagewise exposing a positive-working lithographic printing plate precursor with infrared radiation to form an imaged precursor comprising exposed regions and non-exposed regions, and processing the imaged precursor to remove the exposed regions using a processing solution having a pH of 12 or more, that contains a metal cation $M^{2+}$ selected from barium, calcium, strontium, and zinc cations, and is substantially silicate-free. The positive-working lithographic printing plate precursor comprises a grained and anodized aluminum-containing substrate, a first ink receptive layer comprising at least one water-insoluble, alkali solution-soluble or -dispersible first resin, a second ink receptive layer disposed over the first receptive layer, and an infrared radiation absorber in an amount of at least 0.5 weight %, in either or both of the first ink receptive layer and the second ink receptive layer.

18 Claims, No Drawings

METHOD FOR MAKING LITHOGRAPHIC PRINTING PLATES

RELATED APPLICATION

Reference is made to commonly assigned U.S. Ser. No. 13/602,367 (filed Sep. 4, 2012 by Hauck, Dietmar, and Savariar-Hauck) that is now granted as U.S. Pat. No. 8,936,899, and the disclosure of which is incorporated herein by reference in its entirety.

FIELD OF THE INVENTION

This invention relates to a method for providing lithographic printing plates from corresponding dual-layer positive-working lithographic printing plate precursors using infrared radiation imagewise exposure and unique processing conditions.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Imageable elements (lithographic printing plate precursors) useful to prepare lithographic printing plates typically comprise one or more imageable layers applied over the hydrophilic surface of a substrate. The imageable layers include one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged regions are removed, the imageable element is considered as positive-working. Conversely, if the non-imaged regions are removed, the imageable element is considered as negative-working. In each instance, the regions of the imageable layer (that is, the image areas) that remain are ink-receptive, and the regions of the hydrophilic surface revealed by the developing process accept water and aqueous solutions, typically a fountain solution, and repel ink.

Direct digital or thermal imaging has become increasingly important in the printing industry because of their stability to ambient light. The lithographic printing plate precursors used for the preparation of lithographic printing plates have been designed to be sensitive to heat or infrared radiation and can be exposed using thermal heads of more usually, infrared laser diodes that image in response to signals from a digital copy of the image in a computer a platesetter. This "computer-to-plate" technology has generally replaced the former technology where masking films were used to image the elements.

These imaging techniques often require the use of water or a developer (neutral to alkaline pH) as a processing solution to remove exposed (positive-working) or non-exposed (negative-working) regions of the imaged layer(s). In general, the processing solution is specifically designed for the specific radiation-sensitive chemistry in the imaged precursor and to provide processing as cleanly as possible.

During processing of imaged lithographic printing plate precursors, some processing solutions cause corrosion of aluminum-containing substrates and the industry has been investigating means for reducing or preventing corrosion. For example, some processing solutions contain various corrosion inhibitors and in other instances, the aluminum-containing substrates are pretreated to reduce corrosion.

Some commercial dual-layer positive-working lithographic printing plate precursors are imagewise exposed using infrared radiation and then processed with a processing solution containing a silicate as a corrosion inhibitor as described for example in U.S. Patent Application Publications 2004/0063036 (Takamiya) and 2009/0162783 (Levanon et al.). However, it is well known that silicate-containing processing solutions become "dirty" with sludge after continued use. In addition, when silicate dries in the processing solution tank or other parts of the equipment, carbon dioxide from the air neutralizes the silicate to form crusted silicon dioxide that is difficult to remove during maintenance operations.

Other commercial plate makers design positive-working lithographic printing plate precursors for processing with processing solutions containing non-reducing sugars as corrosion inhibitors as noted also in U.S. Patent Application Publication 2004/0063036 (noted above). However, these materials are generally less effective than silicates and are effective only with aluminum-containing substrate that have been pretreated for example using a post-anodic phosphate/fluoride treatment solution that itself is prone to form insoluble deposits on rollers and equipment surfaces used in the post-anodic treatment process, and thus requires frequent laborious cleaning.

It would be desirable to process imagewise exposed positive-working lithographic printing plate precursors using processing solutions that are substantially free of silicate, without requiring that the precursors be made using a dirty post-anodic treatment process.

SUMMARY OF THE INVENTION

The present invention is directed to the noted problems with a method for forming a lithographic printing plate, the method comprising:

imagewise exposing a positive-working lithographic printing plate precursor with infrared radiation to form an imaged precursor comprising exposed regions and non-exposed regions, and processing the imaged precursor to remove the exposed regions using a processing solution to provide a lithographic printing plate, wherein the positive-working lithographic printing plate precursor comprises:

a grained and anodized aluminum-containing substrate, a first ink receptive layer that is disposed over the grained and anodized aluminum-containing substrate, the first ink receptive layer comprising at least one water-insoluble, alkali solution-soluble or -dispersible first resin, a second ink receptive layer disposed over the first receptive layer, the second ink receptive layer being the outermost layer in the positive-working lithographic printing plate precursor, and comprising a second resin that is a phenolic resin that is different from the water-insoluble, alkali solution-soluble or -dispersible first resin, and an infrared radiation absorber in an amount of at least 0.5 weight %, in either or both of the first ink receptive layer and the second ink receptive layer, wherein the processing solution contains a metal cation $M^{2+}$ selected from calcium, barium, strontium, magnesium, nickel and zinc cations as corrosion inhibitors, has a pH of at least 12, is substantially free of silicate, and is optionally substantially free of reducing sugar.

The first and second ink receptive layers are specifically designed for improved resistance to pressroom chemicals and for scratch and abrasion resistance without loss of photospeed, image contrast, or image durability. Moreover, corrosion is reduced during processing even with aluminum-containing substrates that are prepared without dirty post-anodic treatments. Thus, sludge and silicon dioxide crusting are reduced.

DETAILED DESCRIPTION OF THE INVENTION

The following discussion is directed to various embodiments of the present invention and while some embodiments can be particularly useful, the disclosed embodiments should not be interpreted or otherwise considered to be limited the scope of the present invention, as claimed below. In addition, one skilled in the art will understand that the following disclosure has broader application than is explicitly described and the discussion of any embodiment is not intended to limit the scope of the present invention to any described embodiment.

Definitions

As used herein to define various components of the various ink receptive layers (and coating formulations) and processing solutions, unless otherwise indicated, the singular forms "a", "an", and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term's definition should be taken from a standard dictionary.

The use of numerical values in the various ranges specified herein, unless otherwise expressly indicated otherwise, are considered to be approximations as though the minimum and maximum values within the stated ranges were both preceded by the word "about". In this manner, slight variations above and below the stated ranges can be used to achieve substantially the same results as the values within the ranges. In addition, the disclosure of these ranges is intended as a continuous range including every value between the minimum and maximum values.

Unless the context indicates otherwise, when used herein, the terms "lithographic printing plate precursor", "positive-working lithographic printing plate precursor", and "precursor" are meant to be references to embodiments used in the present invention.

The term "support" is used herein to refer to an aluminum-containing material (web, sheet, foil, or other form) that is then treated to prepare a "substrate" that refers to the hydrophilic article upon which ink receptive layers are disposed.

The term "post-treatment" refers to contacting the grained and anodized aluminum-containing support with an aqueous solution at an appropriate temperature for a period of time, followed by rinsing and drying, before any ink receptive layer formulations are applied.

The precursors are "double-layer precursors" having two ink receptive layers identified as a first receptive layer nearest the substrate and a second ink receptive layer that is disposed over the first receptive layer. In some literature, the first ink receptive layer is known as the "inner" or inside imageable layer, and the second ink receptive layer is known as the "outer" or outside imageable layer.

The term "ink receptive", as applied to the layers in the precursors, refers to a coating or layer material to which, after imaging and development, lithographic ink is attracted.

Unless otherwise indicated, percentages refer to percents by dry weight of a composition or layer, or % solids of a solution or formulation.

As used herein, the term "infrared" refers to radiation having a wavelength of at least 700 nm and higher. In most instances, the term "infrared" is used to refer to the "near-infrared" region of the electromagnetic spectrum that is defined herein to be at least 700 nm and up to and including 1400 nm.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the terms "polymer" and "polymeric" refer to high and low molecular weight polymers including oligomers and includes homopolymers and copolymers.

The term "copolymer" refers to polymers that are derived from two or more different monomers, in random order along the polymer backbone. That is, they comprise recurring units having different chemical structures.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

As used herein with reference to the processing solutions, the term "silicate" is meant to include both silicate and metasilicate compounds.

Positive-working Lithographic Printing Plate Precursors

Grained and Anodized Aluminum-containing Substrate:

In general, the lithographic printing plate precursors are formed by suitable application of two ink receptive layer compositions to a suitable aluminum-containing substrate to form two ink receptive layers. This aluminum-containing substrate is usually treated or coated in various ways as described below prior to application of the formulation(s). For example, the aluminum-containing substrate is treated to provide an "interlayer" for improved adhesion or hydrophilicity, and the first ink receptive layer and second ink receptive layer, are applied over the interlayer.

The aluminum-containing substrate generally has a hydrophilic surface, or a surface that is more hydrophilic than the applied first and second ink receptive layer formulations on the imaging side. The aluminum-containing substrate comprises an aluminum support that is treated using mechanical graining, electrochemical graining or chemical graining to form a desired rough surface, followed by anodizing using a suitable acid to provide the desired anodic oxide surface and a desired oxide pore diameter. The aluminum sheet is mechanically or electrochemically grained and anodized using phosphoric acid or sulfuric acid and conventional procedures.

For example, an electrochemically grained aluminum support can be anodized in a direct current passing through a sulfuric acid solution (5-30 weight %) at a temperature of at least 20° C. and up to and including 60° C. for at least 5 seconds and up to and including 250 seconds to form an oxide layer on the metal surface. Generally, sulfuric acid anodization is carried out to provide an aluminum oxide layer of at least 0.3 g/m² and typically at least 1 g/m² and up to and including 10 g/m², or up to and including 5 g/m².

The sulfuric acid formed aluminum oxide layer generally has fine concave parts that are sometimes referred as "micropores" or "pores" that are distributed, perhaps uniformly, over the layer surface. The density (or vacancy) is generally controlled by properly selecting the conditions of the sulfuric acid anodization treatment. The pores can appear as columns within the aluminum oxide layer, as viewed in a cross-sectional micro-image.

An interlayer is formed or disposed directly on the grained and anodized aluminum-containing substrate by treatment of the grained and anodized aluminum-containing support with an aqueous solution (hereafter referred as PAT solution), followed by rinsing and drying. A particularly useful PAT solution comprises a homopolymer of vinyl phosphonic acid, poly(vinyl phosphonic acid) (PVPA), or a copolymer of vinyl phosphonic acid. A more desirable PAT solution further comprises phosphoric acid. A typical PAT solution can be prepared by dissolving poly(vinyl phosphonic acid) in water in an amount of at least 0.05 weight % and up to and including 20 weight % and phosphoric acid in an amount from 0 to 10 weight %.

The thickness of the grained and anodized aluminum-containing substrate (with interlayer) can be varied but should be sufficient to sustain the wear from printing and thin enough to wrap around a printing form. Some embodiments include a grained and anodized aluminum-containing substrate that has a thickness of from at least 100 μm and up to and including 600 μm.

The backside (non-imaging side) of the grained and anodized aluminum-containing substrate can be coated with a non-radiation-sensitive slipping or matte layer to improve handling and "feel" of the lithographic printing plate precursor.

The grained and anodized aluminum-containing substrate can also be in a cylindrical form having the poly(vinyl phosphonic acid) interlayer and imageable layer(s) disposed thereon, and thus be an integral part of the printing press. The use of such imageable cylinders is described for example in U.S. Pat. No. 5,713,287 (Gelbart) that is incorporated herein by reference.

First Ink Receptive Layer:

A first ink receptive layer is disposed over the grained and anodized aluminum-containing substrate described above. In most embodiments, this first ink receptive layer is disposed directly on the substrate described above, meaning that there are no intervening layers between them.

The first ink receptive layer comprises at least one water-insoluble, alkali solution-soluble or -dispersible first resin (polymeric binder). Desirably, the first resin is resistant to harsh press chemicals that contain strong organic solvents such as glycol ethers and diacetone alcohol. More particularly, the first resin can participate in crosslinking reactions during high temperature baking of the precursor after imaging and processing.

Useful first resins for the first ink receptive layer include polymer binders comprising recurring units derived from one or more N-alkoxymethyl (alkyl)acrylamides or alkoxymethyl (alkyl)acrylates as described for example in U.S. Patent Application Publication 2011/0097666 (Savariar-Hauck et al.) and U.S. Pat. No. 8,530,141 (Savariar-Hauck et al.), both of which are incorporated herein by reference for details of such polymers and ethylenically unsaturated polymerizable monomers from which such recurring units can be derived, including those defined by Structure (II) in the noted publications. Of these materials, the N-alkoxymethyl (meth)acrylamides are particularly useful and can comprise up to and including 80 weight % of the total recurring units in the polymeric binder. Examples of useful ethylenically unsaturated polymerizable monomers include but are not limited to, N-methoxymethyl methacrylamide, N-isopropoxymethyl methacrylamide, N-n-butoxymethyl methacrylamide, N-isobutoxymethacrylamide, N-t-butoxymethacrylamide, N-ethylhexoxymethacrylamide, N-ethoxymethyl acrylamide, and N-cyclohexyloxymethyl methacrylamide. Useful alkoxymethyl (meth)acrylates include but are not limited to, isopropoxymethyl methacrylate, phenoxymethyl methacrylate, methoxymethyl acrylate, phenoxymethyl acrylate, and ethoxymethyl acrylate.

Other useful polymeric binders (first resins) in the first ink receptive layer include those described in U.S. Pat. No. 7,858,292 (Bauman et al.) that comprise recurring units comprising pendant 1H-tetrazole groups, which reference is incorporated herein by reference for the details of such polymeric binders.

Mixtures of one or more first resins comprising recurring units derived from N-alkoxymethyl (alkyl)acrylamides with one or more polymeric binders comprising recurring units comprising pendant tetrazole groups can be used if desired. Alternatively, the polymeric binders can comprise recurring units derived from N-alkoxymethyl (alkyl)acrylamides and recurring units comprising pendant tetrazole groups. In such polymeric binders, the recurring units derived from the N-alkoxymethyl (alkyl)acrylamides can be present in an amount of at least 2 weight % and up to and including 80 weight %, and the recurring units comprising pendant tetrazole groups can be present in an amount of at least 5 weight % and up to and including 80 weight %. Such polymeric binders can also comprise recurring units having pendant cyano groups (for example, at least 10 weight %) and other recurring units having pendant carboxy, phospho, or sulfo groups, or recurring units derived from Structures D1 through D5 of U.S. Patent Application Publication 2009/0042135 (Patel et al.) that is incorporated herein by reference for these recurring units.

In general, each first resin has an acid value of at least 30 mg KOH/g of polymeric binder or an acid value of at least 40 mg KOH/g of polymeric binder and up to and including 150 mg KOH/g of polymeric binder. Acid value can be determined using known methods.

In the lithographic printing plate precursors, the one or more first resins are present in the first ink receptive layer an amount of at least 10 weight % and typically of at least 20 weight % and up to and including 100 weight % of the first ink receptive layer total dry weight.

The first ink receptive layer can additionally comprise one or more surfactants, dispersing aids, humectants, biocides, viscosity builders, drying agents, defoamers, preservatives, antioxidants, colorants, or organic or inorganic particles, all in amounts that are known in the art.

The first ink receptive layer can be formed by applying a first ink receptive layer formulation to the interlayer of the grained and anodized aluminum-containing substrate using conventional coating or lamination methods. Thus, the formulation can be applied by dispersing or dissolving the desired ingredients (one or more first resins and infrared radiation absorber, described below, if present) in a suitable coating solvent, and the resulting formulation is applied to the interlayer of the grained and anodized aluminum-containing substrate using suitable equipment and procedures, such as spin coating, knife coating, gravure coating, die coating, slot coating, bar coating, wire rod coating, roller coating, or extrusion hopper coating. The first ink receptive formulation can also be applied by spraying it onto an interlayer.

The dry coating weight for the first ink receptive layer can be at least 0.5 g/m² and up to and including 2.5 g/m² and typically at least 0.6 g/m² and up to and including 2 g/m².

The selection of solvents used to coat the first ink receptive layer formulation depends upon the nature of the polymeric materials and other components in the formulations, and can include acetone, methyl ethyl ketone, or another ketone, tetrahydrofuran, 1-methoxypropan-2-ol, 1-methoxy-2-propyl acetate, and mixtures thereof using conditions and techniques well known in the art. The coated first ink receptive layer can be dried in a suitable manner.

Second Ink Receptive Layer:

The second ink receptive layer is disposed over the first ink receptive layer, and in most embodiments, there are no intermediate layers between the first ink receptive layer and the second ink receptive layer and thus, the second ink receptive layer is disposed directly on the first ink receptive layer. In addition, the second ink receptive layer generally serves as the outermost layer of the positive-working lithographic printing plate precursor.

Before thermal imaging, the second ink receptive layer is generally not soluble or removable by an alkaline processing solution within the usual time allotted for development, but after thermal imaging, the exposed regions of the second ink receptive become soluble in or removable by the processing solution.

The second ink receptive layer can comprise the compositions of ink receptive layers in positive-working lithographic printing plate precursors described for example, in U.S. Pat. No. 6,255,033 (Levanon et al.), U.S. Pat. No. 6,280,899 (et al.), U.S. Pat. No. 6,391,524 (Yates et al.), U.S. Pat. No. 6,485,890 (Hoare et al.), U.S. Pat. No. 6,558,869 (Hearson et al.), U.S. Pat. No. 6,706,466 (Parsons et al.), U.S. Pat. No. 6,541,181 (Levanon et al.), U.S. Pat. No. 7,223,506 (Kitson et al.), U.S. Pat. No. 7,247,418 (Saraiya et al.), U.S. Pat. No. 7,270,930 (Hauck et al.), U.S. Pat. No. 7,279,263 (Goodin), and U.S. Pat. No. 7,399,576 (Levanon), and U.S. Published Patent Applications 2006/0130689 (Timpe et al.), 2005/0214677 (Nagashima), 2004/0013965 (Memetea et al.), 2005/0003296 (Memetea et al.), and 2005/0214678 (Nagashima), all of which are incorporated herein by reference.

The second ink receptive layer generally comprises one or more second resins or polymeric binders that can be the same or different than the first resins (polymeric binders) described above for the first ink receptive layer. Examples of useful second resins include but are not limited to the polymeric binders described in U.S. Pat. No. 7,163,770 (Saraiya et al.), U.S. Pat. No. 7,160,653 (Huang et al.), and U.S. Pat. No. 7,582,407 (Savariar-Hauck et al.).

The second ink receptive layer desirably contains one or more phenolic polymeric binders as second resins that are generally water-insoluble but soluble in alkaline processing solutions (defined below). The term "phenolic" means a hydroxyl-substituted aryl group.

Useful phenolic polymers include but are not limited to, poly(vinyl phenols) or derivatives thereof. They can also include pendant acidic groups such as carboxylic (carboxy), sulfonic (sulfo), phosphonic (phosphono), or phosphoric acid groups that are incorporated into the polymer molecule or pendant to the polymer backbone. Other useful additional phenolic polymers include but are not limited to, novolak resins, resole resins, poly(vinyl acetals) having pendant phenolic groups, and mixtures of any of these resins (such as mixtures of one or more novolak resins and one or more resole resins). Generally, such second resins have a number average molecular weight of at least 3,000 and up to and including 200,000, and typically at least 6,000 and up to and including 100,000, as determined using conventional procedures. Typical novolak resins include but are not limited to, phenol-formaldehyde resins, cresol-formaldehyde resins, phenol-cresol-formaldehyde resins, p-t-butylphenol-formaldehyde resins, and pyrogallol-acetone resins, such as novolak resins prepared from reacting m-cresol or an m,p-cresol mixture with formaldehyde using conventional conditions. For example, some useful novolak resins include but are not limited to, xylenol-cresol resins, for example, SPN400, SPN420, SPN460, and VPN1100 (that are available from AZ Electronics) and EP25D40G and EP25D50G (noted below for the Examples) that have higher molecular weights, such as at least 4,000.

Other useful second resins include polyvinyl compounds having phenolic hydroxyl groups, include poly(hydroxystyrenes) and copolymers containing recurring units of a hydroxystyrene and polymers and copolymers containing recurring units of substituted hydroxystyrenes. Also useful are branched poly(hydroxystyrenes) having multiple branched hydroxystyrene recurring units derived from 4-hydroxystyrene as described for example in U.S. Pat. No. 5,554,719 (Sounik) and U.S. Pat. No. 6,551,738 (Ohsawa et al.), and U.S. Published Patent Applications 2003/0050191 (Bhatt et al.), 2005/0051053 (Wisnudel et al.), and 2008/0008956 (Levanon et al.). These branched polymers can have a weight average molecular weight ($M_w$) of at least 1,000 and up to and including 30,000. In addition, they can have a polydispersity of less than 2. The branched poly(hydroxystyrenes) can be homopolymers or copolymers with non-branched hydroxystyrene recurring units.

Some particularly useful second resins are phenolic polyvinyl acetal resins, for example like those described in at least the following publications: U.S. Pat. No. 7,399,576 (Levanon et al.) and U.S. Pat. No. 7,544,462 (Levanon et al.), and U.S. Patent Application Publications 2006/0154187 (Wilson et al.) and 2009/0162783 (Levanon et al.). Other useful polyvinyl acetal resins are described in copending and commonly assigned U.S. Ser. No. 12/555,040 (Levanon et al.).

Still other useful polyvinyl acetal resins can comprise, in random fashion:

a) vinyl acetal recurring units comprising pendant hydroxyaryl groups, b) recurring units comprising hydroxyaryl ester groups, or c) either or both types of recurring units (Ia) and (Ib), in random fashion.

In such second resins can comprise recurring units represented by either or both of the following Structures (Ia) and (Ib), in random fashion:

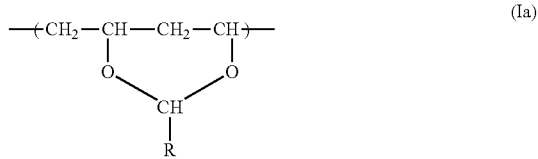

-continued

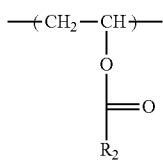
(Ib)

that are described in more detail below.

Still other embodiments include the use of a second resin that comprises, in random fashion, in addition to the recurring units from Structures (Ia) and (Ib), of at least 25 and up to and including 60 mol % of recurring units represented by the following Structure (Ic):

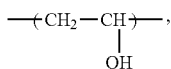
(Ic)

and optionally up to 25 mol % of recurring units represented by the following Structure (Id), optionally up to 10 mol % of recurring units represented by the following Structure (Ie), and optionally up to 20 mol % of recurring units represented by the following Structure (If), in random fashion, all based on the total recurring units in the polymeric binder:

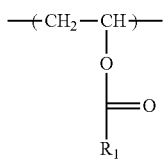
(Id)

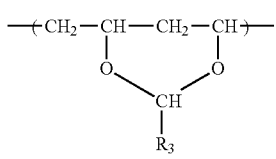
(Ie)

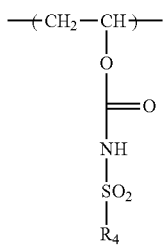
(If)

which Structures (Ic) through (If) are described in more detail below.

In Structures (Ia) and (Ib), R is a substituted or unsubstituted hydroxyaryl group such as a substituted or unsubstituted hydroxyphenyl or hydroxynaphthyl group wherein the aryl group has 1 to 3 hydroxyl groups on the ring. Typically, there is only 1 hydroxyl group on the aryl ring. Other substituents that can optionally be present on the aryl group include but are not limited to, alkyl, alkoxy, halogen, and any other group that does not adversely affect the performance of the polymeric binder in the imageable element. $R_2$ is a substituted or unsubstituted hydroxyaryl group in which the hydroxyl group is ortho to the ester linkage. Some of the $R_2$ groups are substituted with a cyclic imide group, for example a substituted or unsubstituted hydroxyphenyl or hydroxynaphthyl group that has a cyclic imide substituent such as an aliphatic or aromatic imide group, including but not limited to, maleimide, phthalimide, tetrachlorophthalimide, hydroxyphthalimide, carboxyphthalimide, and naphthalimide groups. Further optional substituents on $R_2$ include but are not limited to, hydroxyl, alkyl, alkoxy, halogen, and other groups that do not adversely affect the properties of the cyclic imide group or the polymeric binder in the imageable element. A hydroxyphenyl group, with a cyclic imide substituent and no other substituents, is useful in the polymeric binder.

In Structure (Id), $R_1$ is hydrogen or a substituted or unsubstituted linear or branched alkyl group having 1 to 12 carbon atoms (such as methyl, ethyl, n-propyl, n-butyl, n-pentyl, n-hexyl, chloromethyl, trichloromethyl, iso-propyl, iso-butyl, t-butyl, iso-pentyl, neo-pentyl, 1-methylbutyl, iso-hexyl, and dodecyl groups), a substituted or unsubstituted cycloalkyl having 5 to 10 carbon atoms in the carbocyclic ring (such as cyclopentyl, cyclohexyl, 4-methylcyclohexyl, and 4-chlorocyclohexyl), or a substituted or unsubstituted aryl group having 6 or 10 carbon atoms in the aromatic ring (such as phenyl, naphthyl, p-methylphenyl, and p-chlorophenyl). Such groups can be substituted with one or more substituents such as alkyl, alkoxy, and halogen, or any other substituent that a skilled worker would readily contemplate that would not adversely affect the performance of the polymeric binder in the imageable element.

In Structure (Ie), $R_3$ is a substituted or unsubstituted linear or branched alkyl group having 1 to 12 carbon atoms, or an aryl group (such as phenyl or naphthyl group) that is substituted with an —$O_x$—$(CH_2)_y$—COOH group wherein x is 0 or 1 and y is 0, 1, or 2. Typically, x is 1 and y is 1, and the aryl group is a phenyl group. This aryl group can have further substituents such as alkyl, alkoxy, or halogen that do not adversely affect the performance of the polymeric binder in the imageable element.

In Structure (If), $R_4$ is a substituted or unsubstituted aryl group having 6 or 10 carbon atoms in the aromatic ring (such as phenyl or naphthyl) and that can have one or more substituents such as alkyl, alkoxy, and others that a skilled worker would readily contemplate as not adversely affecting the properties of the polymeric binder in the imageable element.

In addition to the second resins described above, the second ink receptive layer can comprise a third water-insoluble, alkali-soluble or -dispersible resin that comprises a polysiloxane unit segment in a polyurethane or polyurethane urea backbone or side chain. The polysiloxane unit segments can be introduced into the resins by reacting at least one polyisocyanate with a compound having mono- or difunctional terminal hydroxy or amine groups. Thus, the polysiloxane can be reacted with siloxane diols or diamines in a polyaddition reaction. Alternatively, they can be introduced by using siloxane functionalized isocyanates, or anhydrides can be used to introduce the polysiloxane unit segments into polyurethane chains. Introduction of the polysiloxane unit segments thus can be accomplished by either copolymerization or grafting procedures (grafting the polysiloxane unit segments to a main polymer chain using acetalization) that are known in the art and such introduction of the desired moieties would be readily apparent to a skilled worker in view of the teaching in this disclosure.

The term "polyisocyanate" refers to a compound that comprises two or more isocyanate groups. In most embodiments, the polyisocyanate is a diisocyanate comprising two isocyanate groups.

In many embodiments, the third alkali solution-soluble or -dispersible resin is a polyurethane or polyurethane urea that is derived from:

(i) reacting at least one polyisocyanate with a compound comprising difunctional terminal hydroxyl or amine groups, wherein the polyisocyanate is functionalized with a polysiloxane segment, either in its main chain or a side chain, or (ii) reacting at least one polyisocyanate with a compound comprising mono- or difunctional terminal hydroxyl or amine groups, wherein the compound also comprises polysiloxane segments either in its main chain or a side chain.

The polyurethane urea can also comprise a substituent having an acidic hydrogen atom, for example, in specific polymer units. For example, the substituent having an acidic hydrogen atom can be selected from the group consisting of a carboxy group, —SO$_2$NHCOO— group, —CONHSO$_2$— group, —CONHSO$_2$NH— group, and —NHCONHSO$_2$— group. A carboxy group is particularly useful. Multiple different substituents can be present in the same molecule.

The polysiloxane moiety can have a linear, a partially branched, branched, or cyclic structure, and a linear structure is particularly useful. The linear polysiloxane moiety can be R$_3$SiO—(R$_2$SiO)i-R$_2$Si—, R$_3$SiO—(R$_2$SiO)j-R$_2$SiO— and similar groups that would be readily apparent to a skilled worker, wherein the R groups independently represent an alkyl group having 1 to 20 carbon atoms, an aryl group having 6 to 20 carbon atoms, or an aralkyl group (aryl-substituted alkyl groups) having 7 to 20 carbon atoms; and i and j are independently integers of from 1 to and including 10,000. The noted alkyl groups include but are not limited to, substituted or unsubstituted linear or branched alkyl groups such as a methyl, ethyl, n-propyl, iso-butyl, pentyl, hexyl, heptyl, and octyl groups, and cycloalkyl groups such as substituted or unsubstituted cyclopentyl and cyclohexyl groups. Also included are alkyl groups in which one or more hydrogen atoms bonded to the carbon atom(s) are at least partially replaced with halogen atom(s) such as fluorine atom(s) or organic group(s) such as hydroxy, epoxy, glycidyl, acyl, carboxyl, amino, methacryl, and mercapto groups.

Useful aryl groups having 6-20 carbon atoms include but are not limited to, substituted or unsubstituted phenyl, tolyl, xylyl, and mesityl groups and aryl groups in which one or more hydrogen atoms bonded to the carbon atom(s) thereof are at least partially replaced with halogen atom(s) such as fluorine atom(s) or organic groups such as hydroxy, epoxy, glycidyl, acyl, carboxyl, amino, methacryl, and mercapto groups. Useful aralkyl groups having 7 to 20 carbon atoms include but are not limited to, substituted or unsubstituted benzyl and phenethyl groups as well as aralkyl groups having 7 to 20 carbon atoms in which one or more hydrogen atoms bonded to the carbon atom(s) thereof are at least partially replaced with halogen atom(s) such as fluorine atom(s) or organic group(s) such as hydroxy, epoxy, glycidyl, acyl, carboxyl, amino, methacryl group, and mercapto groups.

For example, the polyurethane comprising a polysiloxane segment in the backbone or a side chain can be obtained from the reaction of (a) at least one diisocyanate component, (b) at least one diol component that comprises a polysiloxane moiety, (c) at least one diol comprising a substituent having an acidic hydrogen atom, and (d) optionally one or more diols other than (b) and (c).

The molar ratio of the diisocyanate components (a) to the diol components (b), (c), and (d) is generally from at least 0.7:1 to and including 1.5:1. When an isocyanate group remains at the end of the polymer, it is possible to synthesize the resin by treating with alcohols or amines so that an isocyanate group does not finally remain.

The diisocyanate component is not limited as long as it comprises two isocyanate groups. Examples of the diisocyanate component include but are not limited to, 4,4'-diphenylmethane diisocyanate, xylylene diisocyanate, naphthylene-1,5-diisocyanate, tetramethylxylene diisocyanate, hexamethylene diisocyanate, toluene-2,4-diisocyanate, toluene-2,6-diisocyanate, isophorone diisocyanate, hydrogenated xylylene diisocyanate, dicyclohexylmethane diisocyanate, norbomene diisocyanate and trimethylhexamethylene diisocyanate, and dimer acid diisocyanate. Mixtures of these compounds can also be used.

The diol comprising a substituent having an acidic hydrogen atom is not limited but can have a group selected from the group consisting of a carboxy group, —SO$_2$NHCOO— group, —CONHSO$_2$— group, —CONHSO$_2$NH— group, and —NHCONHSO$_2$— group, with the carboxy group being particularly useful.

Diols having a carboxy group include but are not limited to, 3,5-dihydroxybenzoic acid, 2,2-bis(hydroxymethyl)propionic acid, 2,2-bis(hydroxyethyl)propionic acid, 2,2-bis(3-hydroxypropyl)propionic acid, 2,2-bis(hydroxymethyl)acetic acid, bis-(4-hydroxyphenyl)acetic acid, 4,4-bis-(4-hydroxyphenyl)pentanoic acid and tartaric acid. 2,2-Bis(hydroxymethyl)-propionic acid is particularly useful for its reactivity with an isocyanate.

The amount of the diol comprising a substituent having an acidic hydrogen atom is generally at least 10 weight % and up to and including 95% weight %, or typically at least 20 weight % and up to and including 90 weight %, relative to the total weight of the diol components.

The diol having a polysiloxane moiety in the backbone or a side chain is not limited as long as it has the noted polysiloxane moiety. It is particularly useful that it has no silicon atom-bonded hydroxy group.

In some embodiments, the compound in (ii) noted above is a diol that is used to prepare the third alkali solution-soluble or -dispersible resin that has a polysiloxane segment in the backbone or a side chain, and is a hydroxy-modified di-oliganosiloxane having both terminal groups represented by the following structure:

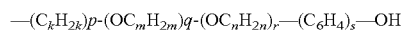

wherein k, m, and n independently represent integers of from 1 to and including 3, p represents an integer of 1 or more, q represents 0 or an integer of from 1 to and including 100, r represents 0 or an integer of from 1 to and including 100, and s represents 0 or an integer of from 1 to and including 3.

In many embodiments, p represents an integer of from 1 to and including 3 (or typically 1 or 2), q represents 0 or an integer of from 1 to and including 50 (or typically 0 or 1 to and including 30), r represents 0 or an integer of from 1 to and including 50 (or typically 0 or 1 to and including 30), and s represents 0, 1, or 2 (or typically 0 or 1).

Useful terminal hydroxy-modified diorganopolysiloxanes can be obtained from a number of commercial sources, including for example the products sold by Shin Etsu Chemical Co., Ltd. as X-22-160AS, KF-6001, KF-6002, KF-6003, X-22-4272, X-22-4952, X-22-6266, X-22-1821 and X-22-1824B.

In other embodiments, the compound in (ii) noted above is a diol that is used to prepare a second alkali solution-soluble or -dispersible resin, and has a polysiloxane segment in its backbone or a side chain, which polysiloxane segment is a diol-modified di-organopolysiloxane that is represented by the following structure:

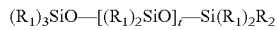

$(R_1)_3SiO—[(R_1)_2SiO]_t—Si(R_1)_2R_2$ wherein the multiple $R_1$ groups independently represent a substituted or unsubstituted alkyl group (having 1 to 20 carbon atoms including substituted alkyl groups such as aralkyl groups) or a substituted or unsubstituted aryl group (having 6 to 20 total carbon atoms including the carbon atoms in the aromatic ring, such as substituted or unsubstituted phenyl or naphthyl groups including alkyl substituted phenyl or naphthyl groups).

$R_2$ represents the following structure:

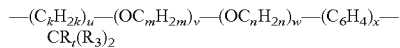

—$(C_kH_{2k})_u$—$(OC_mH_{2m})_v$—$(OC_nH_{2n})_w$—$(C_6H_4)_x$—$CR_t(R_3)_2$ wherein k, m, and n independently represent integers of from 1 to and including 3, u represents an integer or 1 or more, v represents 0 or an integer of from 1 to and including 100, w represents 0 or an integer of from 1 to and including 100, and x represents 0 or an integer of from 1 to and including 3, $R_3$ represents —$(C_yH_{2y})_z$OH wherein y represents an integer of from 1 to and including 3 and z represents an integer of from 1 to and including 100, and t represents an integer of from 1 to and including 10,000.

In some embodiments of $R_2$, u represent an integer of from 1 to and including 3 (typically 1 or 2), v represents 0 or an integer of from 1 to 50 (typically 0 or an integer of from 1 to and including 30), w represents 0 or an integer of from 1 to 50 (typically 0 or an integer of from 1 to and including 30), x represents 0 or 2 (typically 0), y represents 1 or 2, z represents an integer of from 1 to and including 30 (typically 1 or 2), and t represents at least 100 and up to and including 10,000. The sum of v and w can be 1 in some embodiments.

Useful terminal hydroxy-modified diorganopolysiloxanes can be obtained from various commercial sources including Shin Etsu Chemical Co., Ltd. such as products X-22-176DX and X-22-176F.

The third alkali solution-soluble or -dispersible resin is generally present in the second ink receptive layer in an amount of at least 1 weight % and up to and including 40 weight %, and typically of at least 3 weight % and up to and including 30 weight %, all based on the second ink receptive layer total dry weight.

The second ink receptive layer can also include one or more colorants as described for example in U.S. Pat. No. 6,294,311 (Shimazu et al.) including triarylmethane dyes such as ethyl violet, crystal violet, malachite green, brilliant green, Victoria blue B, Victoria blue R, and Victoria pure blue BO. These compounds can act as contrast dyes that distinguish the non-exposed regions from the exposed regions in the imaged and developed precursor. The second ink receptive layer can also optionally include other contrast dyes, printout dyes, coating surfactants, dispersing aids, humectants, biocides, viscosity builders, drying agents, defoamers, preservatives, and antioxidants, all in amounts that are known in the art.

Other materials can be present in the outermost imageable layer including but not limited to, contrast dyes, coating surfactants, dispersing aids, humectants, biocides, viscosity builders, drying agents, defoamers, preservatives, and antioxidants. Such materials can be incorporated in amounts that would be readily apparent to a skilled worker in the art. For example, the following publications describe optional components for the outermost imageable layer useful in positive-working lithographic printing plate precursors: EP 1,543,046 (Timpe et al.), WO 2004/081662 (Memetea et al.), U.S. Pat. No. 6,255,033 (Levanon et al.), U.S. Pat. No. 6,280,899 (Hoare et al.), U.S. Pat. No. 6,391,524 (Yates et al.), U.S. Pat. No. 6,485,890 (Hoare et al.), U.S. Pat. No. 6,558,869 (Hearson et al.), U.S. Pat. No. 6,706,466 (Parsons et al.), U.S. Pat. No. 6,541,181 (Levanon et al.), U.S. Pat. No. 7,223,506 (Kitson et al.), U.S. Pat. No. 7,247,418 (Saraiya et al.), U.S. Pat. No. 7,270,930 (Hauck et al.), U.S. Pat. No. 7,279,263 (Goodin), and U.S. Pat. No. 7,399,576 (Levanon), EP 1,627,732 (Hatanaka et al.), and U.S. Published Patent Applications 2005/0214677 (Nagashima), 2004/0013965 (Memetea et al.), 2005/0003296 (Memetea et al.), and 2005/0214678 (Nagashima) the disclosures of all of which are incorporated herein by reference.

The second ink receptive layer can further comprise one or more developability enhancing compounds. A "developability-enhancing compound" is an organic compound that, when added reduces the minimum exposure energy required to completely remove the ink receptive layer in the exposed regions, in a suitable developer selected for that imageable layer, relative to the minimum exposure energy required to completely remove the same ink receptive layer in the exposed regions except for the exclusion of the organic compound. This difference will depend up on the particular organic compound and ink receptive layer composition used. In addition, such organic compounds can also be characterized as not substantially absorbing exposing radiation selected for the particular ink receptive layer, and generally have a molecular weight of less than 1000 g/mol.

Acidic Developability-Enhancing Compounds (ADEC), such as carboxylic acids or cyclic acid anhydrides, sulfonic acids, sulfinic acids, alkylsulfuric acids, phosphonic acids, phosphinic acids, phosphonic acid esters, phenols, sulfonamides, or sulfonimides can permit further improved developing latitude and printing durability. Representative examples of such compounds are provided in [0030] to [0036] of U.S. Patent Application Publication 2005/0214677 (Levanon et al.).

The second ink receptive layer can also include a developability-enhancing composition containing one or more developability-enhancing compounds (DEC) as described in U.S. Patent Publication No. 2009/0162783 (noted above). Still other useful developability-enhancing compounds are also described in this publication using the following Structure ($DEC_1$):

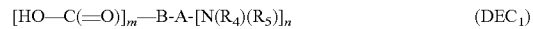

$[HO—C(=O)]_m—B-A-[N(R_4)(R_5)]_n$         ($DEC_1$)

wherein $R_4$ and $R_5$ in Structure $DEC_1$ are independently hydrogen or substituted or unsubstituted alkyl groups, substituted or unsubstituted cycloalkyl groups, or substituted or unsubstituted aryl groups, A is an organic linking group that comprises a substituted or unsubstituted phenylene directly attached to —$[N(R_4)(R_5)]_n$, B is a single bond or an organic linking group having at least one carbon, oxygen, sulfur, or nitrogen atom in the chain, m is an integer of 1 or 2, n is an integer of 1 or 2. The "B" organic linking group can be defined the same as A is defined above except that it is not required that B contain an arylene group, and usually B, if present, is different than A.

The one or more developability enhancing compounds described above can be generally present in the second ink receptive layer in an amount of at least 1 weight % and up to and including 30 weight %, or typically at least 2 weight % and up to and including 20 weight %.

The second ink receptive layer generally also comprises thermally inert inorganic particles in an amount of at least 2 weight % and up to and including 20 weight %, or typically of at least 5 weight % and up to and including 15 weight %, based on the total dry weight of the second ink receptive layer. These thermally inert inorganic particles generally have an average particle size of at least 0.5 nm and up to and including 1000 nm, or typically of at least 50 nm and up to and including 500 nm. This average size can be determined using known particle evaluation equipment and procedures. The thermally inert inorganic particles are generally discrete, meaning that they are generally uniformly dispersed within the second resin(s). There can be minor amounts of clumping or agglomeration but such forms are not predominant. To achieve uniform dispersion of the inorganic particles, they are usually mixed well within the second resin(s) using suitable mixing methods and equipment including high shear mills and preparing a pre-dispersion that is then introduced into the second ink receptive layer formulation for application to the layer(s) below.

The term "thermally inert" means that the inorganic particles do not measurably add or detract from the infrared radiation imageability of the second ink receptive layer. Thus, these inorganic particles do not react with the surrounding second resin(s) or other components in the second ink receptive layer to any appreciable extent.

Useful thermally inert inorganic particles include various particulate materials that can be readily purchased from various commercial sources, or modified using known procedures. For example, useful materials of this type include but are not limited to, surface-modified silica particles such as fumed silica particles and sol-gel silica particles as described for example in U.S. Pat. No. 8,043,787 (Hauck et al.). Other useful thermally inert inorganic particles include but are not limited to, particles of calcium carbonate, zinc oxide, aluminum oxide, titanium oxide, and zirconium oxide.

The second ink receptive layer can comprise thermally inert organic polymer particles that are present in an amount of at least 0.1 weight % and up to and including 5 weight %, or typically of at least 0.2 weight % and up to and including 3 weight %, based on the total dry weight of the second ink receptive layer. Such thermally inert organic polymer particles have an average particle size in μm that is at least 1.5 times, or typically from 3 times and up to and including 10 times, the average dry coating weight of the second ink receptive layer in $g/m^2$.

Useful thermally inert organic polymer particles generally include minimal inorganic components although the outer surface of the polymer particles can be partially or wholly covered by inorganic materials such as silica particles. Useful organic polymer particles of this type are described for example in U.S. Pat. No. 8,383,319 (Huang et al.) which organic polymer particles comprise a core of crosslinked polymer(s) that generally comprise at least 95% by volume of the organic particles. The remaining amount of the organic polymer particles can comprise grafted hydrophilic polymeric surface groups that are formed on the crosslinked "core" by polymerizing hydrophilic monomers in the presence of the crosslinked polymeric particles. Further details of such thermally inert organic polymer particles are described in the noted patent that is incorporated herein by reference for such teaching.

Other useful thermally inert organic polymer particles are silicate-coated particles having a crosslinked polystyrene core as described in U.S. Pat. No. 7,097,956 (Miyamoto et al.) that is incorporated herein by reference.

The second ink receptive layer generally has a dry coating coverage (dry coating weight) of at least 0.2 $g/m^2$ and up to and including 2 $g/m^2$ or typically of at least 0.4 $g/m^2$ and up to and including 1.5 $g/m^2$.

Infrared Radiation Absorbers:

One or more infrared radiation absorber (described above) can also be present in the precursors used in the present invention. Such infrared radiation absorbers can be in the first ink receptive layer, the second ink receptive layer, or both of the first and second ink receptive layers. In still other embodiments, there can be an intermediate layer between the first and second ink receptive layers, and this intermediate layer can also include one or more infrared radiation absorbers. In most embodiments, the one or more infrared radiation absorbers are present only in the second ink receptive layer.

The infrared radiation absorber can be present in the precursor in an amount of at least 0.5 weight % and up to and including 20 weight % and typically in an amount of at least 1 weight % and up to and including 5 weight %, based on the total dry weight of the precursor (minus the weight of the substrate). As noted above, the infrared radiation absorber can be located in one or more layers and the amount of the infrared radiation absorber can be apportioned to the respective layers in a desired manner. The particular amount of a given compound to be used could be readily determined by one skilled in the art.

The one or more infrared radiation absorbers are sensitive to near-infrared or infrared radiation, for example of at least 700 nm and up to and including 1400 nm and typically at least 750 nm and up to and including 1250 nm.

For example, useful infrared radiation absorbers include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,153,356 (Urano et al.), U.S. Pat. No. 6,264,920 (Achilefu et al.), U.S. Pat. No. 6,309,792 (Hauck et al.), U.S. Pat. No. 6,569,603 (noted above), U.S. Pat. No. 6,787,281 (Tao et al.), U.S. Pat. No. 7,135,271 (Kawaushi et al.), and EP 1,182,033A2 (noted above). Infrared radiation absorbing N-alkylsulfate cyanine dyes are described for example in U.S. Pat. No. 7,018,775 (Tao).

In addition to low molecular weight IR-absorbers, dyes having IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (noted above), U.S. Pat. No. 6,264,920 (Achilefu et al.), U.S. Pat. No. 6,153,356 (noted above), and U.S. Pat. No. 5,496,903 (Watanabe et al.). Suitable dyes can be formed using conventional methods and starting materials or obtained from various commercial sources including American Dye Source (Baie D'Urfe, Quebec, Canada) and FEW Chemicals (Germany).

Cyanine dyes having an anionic chromophore are also useful. For example, the cyanine dye can have a chromophore having two heterocyclic groups. In another embodiment, the cyanine dye can have from about two sulfonic acid groups, such as two sulfonic acid groups and two indolenine groups as described for example in U.S Patent Application Publication 2005-0130059 (Tao). Another general description of a useful class of suitable cyanine dyes is shown by the formula in [0026] of WO 2004/101280 (Munnelly et al.).

Useful infrared radiation absorbers can also be pigments including carbon blacks such as carbon blacks that are surface-functionalized with solubilizing groups. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Other useful pigments include, but are not limited to, Heliogen Green, Nigrosine Base, iron (III) oxides, manganese oxide, Prussian Blue, and Paris Blue. The size of the pigment particles should not be more than the thickness of the imageable layer and desirably the pigment particle size will be less than half the thickness of the imageable layer.

Preparation of Positive-working Lithographic Printing Plate Precursors

The precursors used in the present invention can be prepared by sequentially applying a first ink receptive layer formulation onto the interlayer (described above), and then applying a second ink receptive layer formulation over the first ink receptive layer (usually when dried) using conventional coating or lamination methods. It is desired to avoid intermixing of the first and second ink receptive layer formulations.

Thus the first and second ink receptive layers can be applied by dispersing or dissolving the desired components for each layer in a suitable coating solvent, and the resulting formulations are sequentially or simultaneously applied to the substrate (with the interlayer) using suitable equipment and procedures, such as spin coating, knife coating, gravure coating, die coating, slot coating, bar coating, wire rod coating, roller coating, or extrusion hopper coating. The ink receptive layer formulations can also be applied by spraying onto the substrate (with the interlayer).

The selection of solvents used to coat both the first and second ink receptive layers depends upon the nature of the polymeric binders and other components in the layer formulations. To prevent the first and second ink receptive layer formulations from mixing or the first ink receptive layer from dissolving when the second ink receptive layer formulation is applied, the second ink receptive layer formulation should be coated from a solvent in which the polymeric binder(s) in the first ink receptive layer are insoluble.

Generally, the first ink receptive layer formulation is coated out of a solvent mixture of methyl ethyl ketone (MEK), 1-methoxy-2-propyl acetate (PMA), γ-butyrolactone (BLO), and water, a mixture of MEK, BLO, water, and 1-methoxypropan-2-ol (also known as Dowanol® PM or PGME), a mixture of diethyl ketone (DEK), water, methyl lactate, and BLO, a mixture of DEK, water, and methyl lactate, or a mixture of methyl lactate, methanol, and dioxolane.

The second ink receptive layer formulation can be coated out of solvents or solvent mixtures that do not dissolve the first ink receptive layer. Typical solvents for this purpose include but are not limited to, butyl acetate, iso-butyl acetate, methyl iso-butyl ketone, DEK, 1-methoxy-2-propyl acetate (PMA), iso-propyl alcohol, PGME, MEK and mixtures thereof.

After drying the layers, the lithographic printing plate precursors can be further "conditioned" with a heat treatment for at least 40° C. and up to and including 90° C. for at least 4 hours usually in a stack of multiple precursors under conditions that inhibit the removal of moisture from the dried layers. During the heat treatment, the lithographic printing plate precursors are wrapped or encased in a water-impermeable sheet material to represent an effective barrier to moisture removal from the precursors, or the heat treatment of the precursors is carried out in an environment in which relative humidity is controlled to at least 25%. In addition, the water-impermeable sheet material can be sealed around the edges of the precursors, with the water-impermeable sheet material being a polymeric film or metal foil that is sealed around the edges of the precursors.

In some embodiments, this heat treatment can be carried out with a stack comprising at least 100 of the same lithographic printing plate precursors, or when the precursor is in the form of a coil or web. When conditioned in a stack, the individual precursors can be separated by suitable interleaving papers. The interleaving papers can be kept between the imageable elements after conditioning during packing, shipping, and use by the customer.

Imaging Conditions

During the method of this invention, the positive-working lithographic printing plate precursor is exposed to a suitable source of exposing infrared radiation depending upon the infrared radiation absorber present in the precursor to provide specific sensitivity that is at a wavelength of at least 700 nm and up to and including 1400 nm, or more likely of at least 750 nm and up to and including 1400 nm. Imagewise exposing provides exposed regions and non-exposed regions in the first ink receptive layer and the second ink receptive layer.

For example, imaging can be carried out using imaging or exposing radiation from an infrared radiation-generating laser (or array of such lasers). Imaging also can be carried out using imaging infrared radiation at multiple infrared wavelengths at the same time if desired. The laser used to expose the lithographic printing plate precursor is usually a diode laser, because of the reliability and low maintenance of diode laser systems, but other lasers such as gas or solid-state lasers can also be used. The combination of power, intensity and exposure time for laser imaging would be readily apparent to one skilled in the art.

The imaging apparatus can be configured as a flatbed recorder or as a drum recorder, with the lithographic printing plate precursor mounted to the interior or exterior cylindrical surface of the drum. An example of an useful imaging apparatus is available as models of Kodak® Trendsetter platesetters available from Eastman Kodak Company that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen USA, Chicago, Ill.) that operates at a wavelength of 810 nm.

Imaging with infrared radiation can be carried out generally at imaging energies of at least 30 mJ/cm$^2$ and up to and including 500 mJ/cm$^2$ and typically at least 50 mJ/cm$^2$ and up to and including 300 mJ/cm$^2$ depending upon the sensitivity of the imageable layer. With these platesetters, any imaging parameters such as the "surface depth" parameter of a Magnus 800 platesetter (Eastman Kodak Company) or the "focus"

parameter of a PlateRite 4300 platesetter (Dainippon Screen Company), are decided by observing the difference in contrast between exposed regions and non-exposed regions in a stepwise imaging process. By using such as stepwise imaged lithographic printing plate precursor, a shortened printing run is possible and the obtained prints are also useful for determining such imaging parameters.

Development and Printing

After imaging, the imaged lithographic printing plate precursors can be processed "off-press" using a suitable processing solution described below. When the positive-working lithographic printing plate precursors are imaged and processed, the imaged (exposed) regions in the first ink receptive layer and second ink receptive layer are removed during processing while the non-exposed regions remain, revealing the grained and anodized aluminum-containing substrate (as well as interlayer on the substrate).

In most embodiments, processing is carried out immediately after the imagewise exposing, thereby avoiding any post-exposure preheating step.

Development off-press can be accomplished using what is known as "manual" development, "dip" development, or processing with an automatic development apparatus (processor). In the case of "manual" development, development is conducted by rubbing the entire imaged precursor with a sponge or cotton pad sufficiently impregnated with a suitable processing solution (described below), and followed by rinsing with water. "Dip" development involves dipping the imaged precursor in a tank or tray containing the appropriate processing solution for at least 10 seconds and up to and including 60 seconds (especially at least 20 seconds and up to and including 40 seconds) under agitation, followed by rinsing with water with or without rubbing with a sponge or cotton pad. The use of automatic development apparatus is well known and generally includes pumping a developer or processing solution into a developing tank or ejecting it from spray nozzles. The imaged precursor is contacted with the processing solution in an appropriate manner. The apparatus can also include a suitable rubbing mechanism (for example a brush or roller) and a suitable number of conveyance rollers. Some developing apparatus include laser exposure means and the apparatus is divided into an imaging section and a developing section.

Thus, the processing solution (or developer) can be applied to the imaged precursor by rubbing, spraying, jetting, dipping, immersing, slot die coating (for example see FIGS. 1 and 2 of U.S. Pat. No. 6,478,483 of Maruyama et al.) or reverse roll coating (as described in FIG. 4 of U.S. Pat. No. 5,887,214 of Kurui et al.), or by wiping the outermost layer with the processing solution or contacting it with a roller, impregnated pad, or applicator. For example, the imaged precursor can be brushed with the processing solution, or it can be poured onto or applied by spraying the imaged surface with sufficient force to remove the non-exposed regions using a spray nozzle system (spray bar) as described for example in [0124] of EP 1,788,431A2 (noted above) and U.S. Pat. No. 6,992,688 (Shimazu et al.). As noted above, the imaged precursor can be immersed in the processing solution and rubbed by hand or with an apparatus. To assist in the removal of the back side coating, a brush roller or other mechanical component can be placed in contact with the back side coating during processing.

The processing solution can also be applied in a processing unit (or station) in a suitable apparatus that has at least one roller for rubbing or brushing the imaged precursor while the processing solution is applied. Residual processing solution can be removed (for example, using a squeegee or nip rollers) or left on the resulting lithographic printing plate without any rinsing step. Excess processing solution can be collected in a tank and used several times, and replenished if necessary from a reservoir. The processing solution replenisher can be of the same concentration as that used in processing, or be provided in concentrated form and diluted with water at an appropriate time.

Useful processing solutions have a pH of at least 12 and up to and including 14, or more likely at least 12 and up to and including 13.7, or at least 12.5 and up to and including 14, and particularly when such processing solutions are substantially free of silicate, meaning that they contain less than 0.5 weight % of silicates and metasilicates, based on total processing solution weight.

Particularly useful processing solutions are described in U.S. Patent Application Publication 2012/0125216 (Levanon et al.) that is incorporated herein by reference. Such processing solutions generally have a pH of at least 12 and typically at least 12 and up to and including 14, or more likely at least 12.5 and up to and including 14. This highly alkaline pH is generally provided using one or more alkali agents other than silicates and metasilicates. Useful alkali agents include alkali metal hydroxides such as sodium hydroxide and potassium hydroxide. Potassium ions can be more prevalent than the sodium ions and the total amount of the alkali metal ions is generally at least 0.3 gram-atom/kg and up to and including 1 gram-atom/kg.

It is also desirable for the processing solutions used in the practice of the present invention are substantially free of non-reducing sugars meaning that the processing solution contains less than 1 weight % of such compounds. Non-reducing sugars refers to compounds having no reducing properties due to the absence of free aldehyde group and ketone group. Non-reducing sugars can be classified into trehalose type oligosaccharides prepared by linking reducing groups together, glycosides prepared by joining a reducing group of sugars with non-sugars, and sugar alcohol prepared by reducing sugars with hydrogenation. Examples of such non-reducing sugars are provided in [0024]-[0026] of U.S. Patent Application Publication 2004/0063036 (noted above).

These processing solutions can also include one or more metal cations ($M^{2+}$) that are generally selected from the group consisting of barium, calcium, strontium, magnesium, nickel and zinc cation. Calcium, strontium, and zinc cations are particularly useful. The metal cations $M^{2+}$ are generally present in the processing solutions in an amount of at least 0.0001 gram-atom/kg, and typically at least 0.001 gram-atom/kg and up to and including 0.01 gram-atom/kg. The desired cations can be provided in the forms of various water-soluble salts that would be readily apparent to one skilled in the art. Examples of such salts are calcium chloride, barium chloride, strontium chloride, zinc acetate, calcium bromide, and calcium nitrate.

The processing solutions can also include one or more chelating agents, each of which has a complex formation constant (log K) for the $M^{2+}$ metal cation of at least 3.5 and less than or equal to 4.5, and a log K for aluminum ion that is 7 or less. Useful chelating agents with these properties include but are not limited to, phosphono-polycarboxylic acids such as phosphonoalkyl polycarboxylic acids, such as 2-phosphonobutane-1,2,4-tricarboxylic acid, which is particularly useful with calcium metal cations.

The described chelating agents can be present in an amount of at least 0.01 mol/liter and up to and including 0.1 mol/liter, or typically at least 0.03 mol/liter and up to and including 0.1 mol/liter.

A cationic surfactant or a betaine can also be present in the processing solutions in an amount of at least 0.01 weight % and typically at least 0.05 weight % and up to and including 3 weight %. Suitable cationic surfactants for use in the present invention include, but are not limited to, quaternary ammonium halides of fatty acids such as a fatty acid quaternary ammonium chloride. One example of such cationic surfactants is provided in Hydromax 300 (Chemax Performance Products, Grenville, S.C.) that is described for example, in U.S. Patent Application Publication 2006/0154187 (Wilson et al.) the disclosure of which is incorporated herein by reference. Another useful cationic surfactant is cetyl trimethyl ammonium chloride.

The processing solutions can also comprise one or more surfactants to achieve the best wetting, stabilizing, solubilizing, protecting, dispersing, and rinsing properties. Such surfactants are generally anionic or nonionic in nature. Useful anionic surfactants are of the alkylaryl sulfonate class, such as an alkylaryl sulfonate, for example, alkyldiphenyloxide disulfonate that is available as Dowfax® 2A1 from Dow Chemical Co. The anionic and nonionic surfactants can be present in an amount of at least 0.1 weight % and up to and including 2 weight %.

Other components of the processing solution include alkali metal hydroxides as alkali agent or one or more quaternary ammonium salts or one or more phosphonium salts, all in suitable amounts.

Particularly useful processing solutions have a pH of at least 12.5 and up to and including 14 and comprise calcium or strontium metal cations, a sodium or potassium hydroxide, 2-phosphonobutane-1,2,4-tricarboxylic acid, and a cationic surfactant.

Although each processing solution can also be used as its own replenisher, in addition, a specially formulated replenisher can be used. In the replenisher composition, the concentration of alkali agent is generally higher than the concentration of the alkali agent in the working strength processing solution, to compensate for the consumption of the alkali agent during the development process.

Following off-press development, the resulting lithographic printing plate can be baked with or without blanket or floodwise exposure to UV or visible radiation. Alternatively, a blanket UV or visible radiation exposure can be carried out, without a postbake operation.

Printing can be carried out by putting the imaged and developed lithographic printing plate on a suitable printing press. The lithographic printing plate is generally secured in the printing plate using suitable clamps or other holding devices. Once the lithographic printing plate is secured in the printing press, printing is carried out by applying a lithographic printing ink and fountain solution to the printing surface of the lithographic printing plate. The fountain solution is taken up by the surface of the hydrophilic substrate revealed by the imaging and processing steps, and the ink is taken up by the remaining regions of the outermost ink receptive layer. The ink is then transferred to a suitable receiving material (such as cloth, paper, metal, glass, or plastic) to provide a desired impression of the image thereon. If desired, an intermediate "blanket" roller can be used to transfer the ink from the lithographic printing plate to the receiving material (for example, sheets of paper). The lithographic printing plates can be cleaned between impressions, if desired, using conventional cleaning means.

The present invention provides at least the following embodiments and combinations thereof, but other combinations of features are considered to be within the present invention as a skilled artisan would appreciate from the teaching of this disclosure:

1. A method for forming a lithographic printing plate, the method comprising:
    imagewise exposing a positive-working lithographic printing plate precursor with infrared radiation to form an imaged precursor comprising exposed regions and non-exposed regions, and
    processing the imaged precursor to remove the exposed regions using a processing solution to provide a lithographic printing plate,
    wherein the positive-working lithographic printing plate precursor comprises:
        a grained and anodized aluminum-containing substrate,
        a first ink receptive layer that is disposed over the grained and anodized aluminum-containing substrate, the first ink receptive layer comprising at least one water-insoluble, alkali solution-soluble or -dispersible first resin,
        a second ink receptive layer disposed over the first receptive layer, the second ink receptive layer being the outermost layer in the positive-working lithographic printing plate precursor, and comprising a second resin that is a phenolic resin that is different from the water-insoluble, alkali solution-soluble or -dispersible first resin, and
        an infrared radiation absorber in an amount of at least 0.5 weight %, in either or both of the first ink receptive layer and the second ink receptive layer,
    wherein the processing solution contains a metal cation $M^{2+}$ selected from barium, calcium, strontium, and zinc cations, has a pH of at least 12, is substantially free of silicate, and is optionally substantially free of reducing sugar.

2. The method of embodiment 1, wherein the second resin is a phenolic polyvinyl acetal resin.

3. The method of embodiment 1 or 2, wherein the second ink receptive layer further comprises thermally inert inorganic particles that are present in an amount of at least 2 weight % and up to and including 20 weight %, based on the total dry weight of the second ink receptive layer, which thermally inert inorganic particles have an average particle size of at least 0.5 nm and up to and including 500 nm.

4. The method of any of embodiments 1 to 3, wherein the second ink receptive layer further comprises thermally inert organic polymer particles that are present in an amount of at least 0.1 weight % and up to and including 5 weight %, based on the total dry weight of the second ink receptive layer, which thermally inert organic polymer particles have an average particle size in μm that is at least 1.5 times average dry coating weight of the second ink receptive layer in $g/m^2$.

5. The method of any of embodiments 1 to 4, wherein the positive-working lithographic printing plate precursor further comprises:
    a poly(vinyl phosphonic acid) interlayer, optionally comprising phosphoric acid or a salt thereof comprising aluminum cation, disposed directly on the grained and anodized aluminum-containing substrate.

6. The method of embodiment 5, wherein the poly(vinyl phosphonic acid) interlayer has been derived by treating the grained and anodized aluminum-containing substrate with a solution comprising poly(vinyl phosphonic acid) and phosphoric acid.

7. The method of any of embodiments 1 to 6, wherein the infrared radiation absorber is present only in the second ink receptive layer.

8. The method of any of embodiments 1 to 7, wherein the second ink receptive layer further comprises a third water-insoluble, alkali-soluble or -dispersible resin that comprises a polysiloxane unit segment in a polyurethane or polyurethane urea backbone or side chain.

9. The method of any of embodiments 1 to 8, wherein the processing solution comprises at least 0.0001 gram-atom/kg of a metal cation $M^{2+}$ selected from the group consisting of barium, calcium, strontium, and zinc cations.

10. The method of any of embodiments 1 to 9, wherein the metal cation $M^{2+}$ is present in the processing solution in an amount of at least 0.001 and up to and including 0.01 gram-atom/kg.

11. The method of any of embodiments 1 to 10, wherein the processing solution further comprises a chelating agent that has a complex formation constant (log K) for the barium, calcium, strontium, or zinc $M^{2+}$ metal cation of at least 3.5 and less than or equal to 4.5, and a complex formation constant (log K) for aluminum ion of 7 or less.

12. The method of any of embodiments 1 to 11, wherein the processing solution further comprises a chelating agent that is a phosphono-polycarboxylic acid.

13. The method of embodiment 12, wherein the processing solution comprises 2-phosphonobutane-1,2,4-tricarboxylic acid.

14. The method of any of embodiments 1 to 13, wherein the processing solution comprises an alkali metal hydroxide as an alkali agent.

15. The method of any of embodiments 1 to 14, wherein the processing solution comprises a cationic surfactant.

16. The method of any of embodiments 1 to 15, wherein the processing solution comprises one or more quaternary ammonium salts or one or more phosphonium salts.

17. The method of any of embodiments 1 to 16, wherein the processing solution has a pH of at least 12.5 and up to and including 14, calcium or strontium metal cations, a sodium or potassium hydroxide, 2-phosphonobutane-1,2,4-tricarboxylic acid, and a cationic surfactant.

18. The method of any of embodiments 1 to 17, further comprising baking the lithographic printing plate after the processing.

19. The method of embodiment 8, wherein the third water-insoluble, alkali-soluble or -dispersible resin further comprises a substituent having an acidic hydrogen atom.

20. The method of any of embodiments 1 to 19, wherein the first ink receptive layer comprise water-insoluble, alkali solution-soluble or -dispersible first resin that comprises recurring units comprising pendant tetrazole groups or recurring units derived from an alkoxymethyl (meth)acrylamide.

The following Examples are provided to illustrate the practice of this invention and are not meant to be limiting in any manner. The following materials were used to prepare the lithographic printing plate precursors used in the Examples:

BLO represents γ-butyrolactone.

Byk® 307 is a polyethoxylated dimethylpolysiloxane copolymer that is available from Byk Chemie (Wallingford, Conn.) or Altana, which is used as a leveling agent.

Polymer A is the same as Polymer A described in U.S. Pat. No. 8,088,549 (Levanon et al.) that is incorporated herein for this material.

Polymer B was a polymer derived from methacylamide-N-tetrazole/methacrylic acid/N-methoxymethyl methacrylamide/N-phenyl maleimide/acrylonitrile at a starting monomer weight % of 15.0/4.2/12.6/23.5/44.7 and the polymer had an acid number of 82 mg KOH/g polymer.

Polymer C was a polyurethane resin made using dimethylolpropionic acid/1,4 butanediol/KF-6001 silicon carbinole (from Shinetsu, Japan)/4,4'-diphenylmethane diisocyanate in a weight ratio of 24/5.76/10.56/59.69.

Polymer D was a polymer derived from methacrylamide, N-phenyl maleimide, and methacrylic acid at a starting monomer weight % ratio of 23.0/67.0/10.0 and Polymer D had an acid number of 65 mg KOH/g polymer.

Polymer E was a polymer derived from methacrylic acid, N-(2-methacryloyloxyethyl)ethylene urea, methyl methacrylate, and acrylonitrile at a starting monomer weight % ratio of 10.6/24.4/22.2/42.8 and Polymer E had an acid number of 69 mg KOH/g polymer.

Substrate A was a 0.3 mm gauge aluminum sheet that had been electrochemically grained and anodized, having a Ra of 0.45 and that had been treated with a solution containing 1.5 g/l of poly(vinyl phosphonic acid) using a spray bar process at 65° C. and 6 seconds dwell time, followed by rinsing and drying, to provide a poly(vinyl phosphoric acid) interlayer.

Substrate B was a 0.3 mm gauge aluminum sheet that had been electrochemically grained and anodized, having a Ra of 0.35 and that had been with a solution containing 1.5 g/l of poly(vinyl phosphonic acid) and 2 g/l of phosphoric acid using a spray bar process at 65° C. and 6 seconds dwell time, followed by rinsing and drying.

Substrate C was a 0.3 mm gauge aluminum sheet that had been electrochemically grained and anodized, having a Ra of 0.35 and that had been treated with as solution to provide a phosphate/fluoride interlayer (as described for example U.S. Patent Application Publication 2012/0270152).

Solvent Mixture L20 was a mixture of methyl ethyl ketone: Dowanol® PM:BLO:H$_2$O:Dioxalane at a weight ratio of 45/20/10/10/15.

Dowanol® PM is a glycol ether solvent available from Dow Chemical Company.

Resol LB9900 is copolymer of phenol and p-cresol from Momentive (Germany).

Particle A refers to silicate coated beads of a crosslinked polystyrene derived from 70 weight % of styrene and 30 weight % of divinyl benzene, particle size of ~6 μm; See Columns 3-5 in U.S. Pat. No. 7,097,956 (Miyamoto et al.) for further details.

Particle B refers to a 10 w/w % dispersion of Aerosil® R9200 (Evonik) and Polymer A in a 9:1 weight ratio made by ball milling in Dowanol® PM until 90% of the particles are smaller than 1.6 μm and 50% of the particles are smaller than 0.5 μm. The particle size distribution curve has a maximum at around 0.42 μm when measured with a Malvern Mastersizer X.

IR Dye A is represented by the structure:

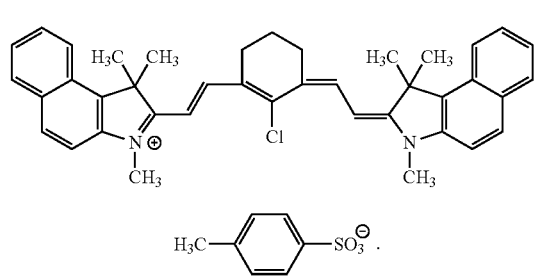

4-DMABA represents dimethyl aminobenzoic acid.

Sudan Black is an azo dye having the structure:

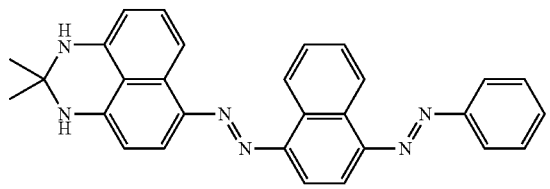 [SMILES: CC1(C)Nc2cccc3c(/N=N/c4ccc(/N=N/c5ccccc5)c5ccccc45)ccc(c23)N1]

Violet 612 is a visible dye having the structure:

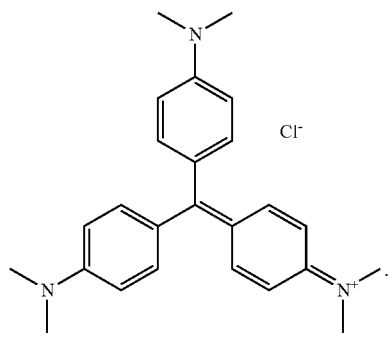

Eosin has the structure:

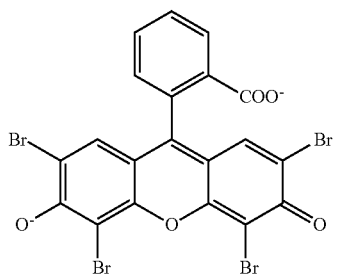

The following materials were used in various developers (processing solutions) used in the Examples:

Bayhibit® AM is 2-phosphonobutane-1,2,4-tricarboxylic acid (Lanxess) used as a complexing agent for calcium cations.

Hydromax™ 300 is an organic quaternary ammonium salt (PCC-Chemax).

Dowfax® A1 is an alkyl diphenyl oxide anionic surfactant (Dow Chemical Company).

Sorbidex® 240 is a 70 wt. % aqueous solution of sorbitol (non-reducing sugar).

Synperonic® T304 is an ethylene/propylene oxide based on ethylene diamine (Croda).

The following Developers (processing solutions) were prepared as shown below in TABLES I and II using the listed components (parts per 100):

Developers 1 and 8-10 are typical of the processing solutions useful in the practice of the present invention.

Developer 2 and 3 were processing solutions like Developer 1 except that calcium ions were omitted.

Developer 4 was a processing solution like Developer 1 except that Hydromax® 300 was omitted.

Developers 5 and 6 were processing solutions containing a non-reducing sugar.

Developer 7 is a silicate-containing processing solution that is commercially available as Kodak 300 Thermal Plate Developer (Eastman Kodak Company) and is typically used to process imaged single-layer positive-working lithographic printing plate precursors such as Electra XD plates.

TABLE I

| Developer Components | Developer 1 Invention | Developer 2 Comparative | Developer 3 Comparative | Developer 4 Comparative | Developer 5 Comparative | Developer 6 Comparative |
|---|---|---|---|---|---|---|
| Deionized water | 91.39 | 91.80 | 91.51 | 91.48 | 71.80 | 73.43 |
| Calcium chloride 2x $H_2O$ | 0.03 | 0 | 0 | 0.03 | 0 | 0 |
| Bayhibit ® AM | 0.38 | 0 | 0.38 | 0.38 | 0 | 0 |
| Trisodium citrate 2x $H_2O$ | 1.50 | 1.50 | 1.50 | 1.50 | 1.50 | 0 |
| Hydromax ™ 300 | 0.09 | 0.09 | 0 | 0 | 0.09 | 0 |
| Dowfax ® 2A1 | 0.50 | 0.50 | 0.50 | 0.50 | 0.50 | 0 |
| KOH (45 wt. %) | 6.11 | 6.11 | 6.11 | 6.11 | 6.11 | 6.47 |
| Sorbidex ® 240 | 0 | 0 | 0 | 0 | 20.00 | 19.90 |
| Synperonic T-304 | 0 | 0 | 0 | 0 | 0 | 0.20 |
| EP1* | 4.4 ml | 4.7 ml | 4.4 ml | 4.4 ml | No data | No data |

*Amount of 0.5 normal HCl used to titrate 5 ml of developer (processing solution).

TABLE II

| Developer Components | Developer 8 Invention | Developer 9 Invention | Developer 10 Invention |
|---|---|---|---|
| Deionized water | 91.75 | 91.31 | 91.01 |
| Calcium chloride 2x $H_2O$ | 0.04 | 0.11 | 0.03 |
| Bayhibit ® AM | 0.50 | 0.38 | 0.76 |
| Trisodium citrate 2x $H_2O$ | 0 | 1.50 | 1.50 |
| Hydromax ™ 300 | 0.10 | 0.09 | 0.09 |
| Dowfax ® 2A1 | 0.50 | 0.50 | 0.50 |
| KOH (45 wt. %) | 7.11 | 6.11 | 6.11 |
| EP1* | 4.1 ml | 4.5 ml | 4.4 ml |

*Amount of 0.5 normal HCl used to titrate 5 ml of developer (processing solution).

Positive-working lithographic printing plate precursors were prepared as follows with the noted layer structure and components:

A first ink receptive layer (Bottom Layer A) was prepared by coating a formulation prepared by dissolving 9.78 g of Polymer B and 0.2 g of Naphthol Blue Black in 120 g of Solvent Mixture L20 onto Substrate A and drying the coating at 80° C. for 2 minutes to provide a dry coating weight of 0.8 g/m$^2$.

Another first ink receptive layer (Bottom Layer B) was prepared by coating a formulation prepared by dissolving 9.6 g of Polymer D and 0.25 g of Naphthol Blue Black in 120 g of Solvent Mixture L20 onto Substrate A and drying the coating at 80° C. for 2 minutes to provide a dry coating weight of 0.8 g/m$^2$.

Still another first ink receptive layer (Bottom Layer C) was prepared by coating a formulation prepared by dissolving 9.6 g of Polymer E and 0.25 g of Eosin in 120 g of Solvent Mixture L20 onto Substrate A and drying the coating at 80° C. for 2 minutes to provide a dry coating weight of 0.8 g/m$^2$.

A second ink receptive layer (Top Layer A) was prepared by applying a formulation prepared by dissolving 7.91 g of a 20 weight % solution of Polymer A in Dowanol® PM, 1.35 g of Resol LB9900, 0.065 g of IR Dye A, 0.026 g of Violet 612, 0.052 g of Sudan Black, 0.130 g of DMABA, 0.026 g of a 10% solution of Byk® 307 in Dowanol®, 0.130 g of Polymer C in 54.6 g of a solvent mixture composed of methyl ethyl ketone (MEK), Dowanol® PM, and BLO at a 50:49:1 weight ratio and stirring in 0.967 g of Particle B and 0.013 g of Particle A.

Another second ink receptive layer (Top Layer B) was prepared by applying a formulation prepared by dissolving 8.04 g of a 20 weight % solution of Polymer A in Dowanol® PM, 1.35 g of Resol LB9900, 0.065 g of IR Dye A, 0.026 g of Violet 612, 0.052 g of Sudan Black, 0.130 g of DMABA, 0.026 g of a 10% solution of Byk® 307 in Dowanol® PM in 56 g of a solvent mixture composed of methyl ethyl ketone (MEK), Dowanol® PM, and BLO at a 50:49:1 weight ratio and stirring in 0.967 g of Particle B and 0.013 g of Particle A.

Positive-working lithographic printing plate precursor (Element A) was prepared by providing Top Layer A to provide a dry layer weight of 0.7 g/m$^2$ on Bottom Layer A. The resulting precursors were then wrapped in aluminum laminated paper and conditioned for 2 days at 60° C. with interleaf paper having a moisture content between 4.5% and 5.5% and 1 day at room temperature.

Additional positive-working lithographic printing plate precursors (Elements B and C) were prepared in the same manner as Element A above except that the Substrates B and C, respectively, were used.

Positive-working lithographic plate precursor (Element D) was prepared in the same manner as Element A above except that the Top Layer A was coated over the Bottom Layer B on Substrate B.

Positive-working lithographic plate precursor (Element E) was prepared in the same manner as Element A above except that the Top Layer B was coated over the Bottom Layer B on Substrate B.

Positive-working lithographic plate precursor (Element F) was prepared in the same manner as Element A above except that the Top Layer B was coated over the Bottom Layer C on Substrate B.

The following evaluations were made of Elements A-F:

Developer Resistance (Soak Test):

To assess the resistance of each precursor to specific developers (processing solutions), referred to as the Soak Test, drops of the developer maintained as 25° C. were placed on the non-exposed precursor at 10 second time intervals and the developer was then rinsed off after 90 seconds. The remaining % OD of the Top Layer coating was noted at 50 seconds.

Developing Speed (Drop Test):

To assess the speed of development, each precursor was imaged at 15 W/360 rpm (100 mJ/cm$^2$). Drops of the developer maintained at 25° C. were placed on the outer surface of a strip of each exposed precursor at 2 second intervals at various dwell times and rinsed off after 30 seconds. The tested regions were then partially inked. The minimum dwell time showing complete dissolution of the outer coating (non-inked Drop Test) and the inked region that was free of toning (inked Drop Test) were noted.

Resistance of Substrate to Corrosion:

To assess corrosion resistance, a strip of each substrate, 2 cm×20 cm was immersed in each developer at dwell times of 15 seconds up to 2 minutes at 15 second increments. The change in the OD at 1 minute was measured as a measure of corrosion, and the higher OD loss indicated higher corrosion.

Clear Point:

To assess the photospeed, each precursor was imaged with test patterns comprising solids and 8×8 checkerboard at 6 W to 18 W in steps of 1 W using a Creo Quantum 800 imagesetter (40 to 120 mJ/cm$^2$). Each exposed precursor was developed by placing it in a dish containing developer for a 10 seconds followed by rubbing the processed precursor with a soft paper tissue for 10 seconds and then rinsing the resulting lithographic printing plate with water. The lithographic printing plates were dried and then evaluated for the clear point that is defined as the minimum energy (mJ/cm$^2$) to give a clear background.

Linearity:

Linearity was measured by imaging 50% Dots 8 pixel×8 pixel Checkerboard (each pixel represents a square in a 2400 dpi grid) on the precursor that was imaged at 15 W 360 rpm. This was done by immersing the imaged precursor in a bath of developer at 25° C. for 10 seconds and by rubbing it for 10 seconds with a soft tissue before rinsing off the precursor with water. Each lithographic printing plate was dried and the 50% dots were measured using a SpectoPlate Techkon densitometer. The lithographic printing plate was considered linear when the 50% dot measured 50%±1%.

Results and Discussion:

The results of the performance evaluations of the Element A-F are provided in the following TABLES III and IV.

TABLE III

| | Developer | Precursor | Soak Test | Substrate Corrosion 1 minute OD loss | Drop Test non-inked (seconds) | Drop Test clean inked (seconds) | Clear Point | 50% Raster at 100 mJ [%] |
|---|---|---|---|---|---|---|---|---|
| Invention Example 1 | 1 | A | 73% | 0.001 | 8 | 10 | 53 | 49.1 |
| Comparative Example 1 | 2 | A | 9% | 0.192 | 6 | >30 | 57 | 49.1 |

TABLE III-continued

| | Developer | Precursor | Soak Test | Substrate Corrosion 1 minute OD loss | Drop Test non-inked (seconds) | Drop Test clean inked (seconds) | Clear Point | 50% Raster at 100 mJ [%] |
|---|---|---|---|---|---|---|---|---|
| Comparative Example 2 | 3 | A | 55% | 0.184 | 6 | >30 | 57 | 49 |
| Comparative Example 3 | 4 | A | 2% | 0.004 | 8 | 10 | 0 | 0 |
| Comparative Example 4 | 5 | A | 98% | 0.078 | >30 | not clean | 140 | 99.8 |
| Comparative Example 5 | 6 | A | 94% | 0.077 | 16 | >30 | 80 | 51.5 |
| Comparative Example 6 | 7 | A | 74% | 0.000 | 16 | >30 | 50 | 48.5 |
| Invention Example 2 | 1 | B | 72% | 0.001 | 8 | 10 | 53 | 49.5 |
| Comparative Example 7 | 2 | B | 10% | 0.190 | 6 | >30 | 57 | 49.1 |
| Comparative Example 8 | 3 | B | 52% | 0.185 | 6 | >30 | 57 | 49.6 |
| Invention Example 3 | 1 | C | 76% | 0.002 | 8 | 10 | 53 | 49.2 |
| Comparative. Example 9 | 2 | C | 11% | 0.192 | 6 | >30 | 57 | 49.4 |
| Comparative Example 10 | 3 | C | 56% | 0.190 | 6 | >30 | 57 | 49.0 |

TABLE IV

| | Developer | Precursor | Soak Test | Substrate Corrosion 1 minute OD loss | Drop Test non-inked (seconds) | Drop Test clean inked (seconds) | Clear Point | 50% Raster at 100 mJ [%] |
|---|---|---|---|---|---|---|---|---|
| Invention Example 4 | 1 | D | 63% | 0.001 | 8 | 10 | 50 | 49 |
| Comparative Example 11 | 2 | D | 7% | 0.21 | 6 | >30 | 55 | 48.9 |
| Comparative Example 12 | 3 | D | 24% | 0.181 | 6 | >30 | 54 | 49 |
| Invention Example 5 | 1 | E | 43% | 0.001 | 6-8 | 8 | 50 | 48.5 |
| Comparative. Example 13 | 2 | E | 3% | 0.212 | 6 | >30 | 49 | 48.9 |
| Comparative Example 14 | 3 | E | 19% | 0.191 | 6 | >30 | 51 | 48.1 |
| Invention Example 6 | 1 | F | 78% | 0.001 | 8 | 8-10 | 57 | 50.1 |
| Comparative. Example 15 | 2 | F | 9% | 0.199 | 6-8 | >30 | 59 | 49.1 |
| Comparative. Example 16 | 3 | F | 53% | 0.191 | 8 | >30 | 55 | 45.0 |
| Invention Example 7 | 8 | A | 70% | 0.003 | 8 | 10 | 53 | 48.4 |
| Invention Example 8 | 9 | A | 79% | 0.001 | 8-10 | 10-12 | 54 | 49.9 |
| Invention Example 9 | 10 | A | 71% | 0.005 | 6-8 | 10 | 53 | 48.9 |

The results provided in TABLES III and IV show that Developers 1 and 8-10 provided the optimum results for processing the imaged positive-working lithographic printing plate precursors according to the present invention, thereby providing a good image and clean background without any corrosion of the substrate (that can lead to toning).

The results also show that the absence of calcium cations and Bayhibit® AM in Developer 2 (see Comparative Examples 1, 7, and 9) made the developer (processing solution) very aggressive towards the ink receptive layer coatings and the precursor substrate. In addition, the inked Drop Test showed that without the calcium cations, the imaged and developed regions on the lithographic printing plate exhibited toning.

Only calcium cations were omitted from Developer 3. As seen by the EP1 values in TABLE I, the alkalinity was reduced relative to that of Developer 2 as part of the potassium hydroxide was neutralized by the 2-phosphonobutane-1,2,4-tricarboxylic acid (Bayhibit® AM). Therefore, Developer 3 provided good images after development even without the presence of calcium cations. However, the substrate corrosion was significant, causing toning upon inking (for example, see Comparative Examples 2, 8, and 10).

Omitting the quaternary ammonium salt as in Developer 4 (Comparative Example 3) caused a strong attack on the image in the lithographic printing plate and thus Developer 4 is not a useful processing solution for the positive-working lithographic printing plates designed for the present invention.

The use of Developers 5 and 6 represent typical use of a non-reducing sugar and the resulting Drop Tests were too slow. Developer 5 was too weak to develop the imaged precursor and also showed significant substrate corrosion (Comparative Example 4).

Developer 6 provided development at much higher energy and again exhibited significant substrate corrosion (Comparative Example 5).

Developer 7 (Comparative Example 6) was a typical silicate-containing developer and it caused no substrate corrosion but exhibited poorer development speed.

Although silicate-containing developers are frequently used in the art, the main disadvantage of their use is the dirtiness of the development processor that occurs due to silicate deposits. These problems became worse when Elements A and B were processed in large volumes. The poly(vinyl phosphonic acid) interlayer had been applied onto the electrochemically grained and anodized aluminum-containing substrates through a spray bar process for convenience only from the upper side of the substrate. The backside of the substrate was thus not protected by the interlayer and therefore some substrate corrosion occurred, resulting in the formation of aluminum silicate sludge in the processor. Element C is, having the desired interlayer application, was less susceptible to substrate corrosion. However, for the ease of manufacturing Substrates A and B are desirable substrates.

Further, it can be seen that although the Substrates B and C were more corrosion resistant compared to Substrate A, omitting calcium cations from Developers 2 and led to significant substrate corrosion and thus toning was evident.

The invention has been described in detail with particular reference to certain specific embodiments thereof, but it will be understood that variations and modifications can be effected within the spirit and scope of the invention.

The invention claimed is:

1. A method for forming a lithographic printing plate, the method comprising:
   imagewise exposing a positive-working lithographic printing plate precursor with infrared radiation to form an imaged precursor comprising exposed regions and non-exposed regions, and
   processing the imaged precursor to remove the exposed regions using a processing solution to provide a lithographic printing plate,
   wherein the positive-working lithographic printing plate precursor comprises:
   a grained and anodized aluminum-containing substrate,
   a first ink receptive layer that is disposed over the grained and anodized aluminum-containing substrate, the first ink receptive layer comprising at least one water-insoluble, alkali solution-soluble or -dispersible first resin,
   a second ink receptive layer disposed over the first receptive layer, the second ink receptive layer being an outermost layer in the positive-working lithographic printing plate precursor, and comprising a second resin that is a phenolic resin that is different from the water-insoluble, alkali solution-soluble or -dispersible first resin, and thermally inert inorganic particles that are present in an amount of at least 2 weight % and up to and including 20 weight %, based on the total dry weight of the second ink receptive layer, which thermally inert inorganic particles have an average particle size of at least 0.5 nm and up to and including 500 nm, and
   an infrared radiation absorber in an amount of at least 0.5 weight %, in either or both of the first ink receptive layer and the second ink receptive layer,
   wherein the processing solution contains a metal cation $M^{2+}$ selected from barium, calcium, strontium, and zinc cations, has a pH of at least 12, is substantially free of silicate, and is optionally substantially free of reducing sugar, and wherein the processing solution further comprises one or more quaternary ammonium salts or one or more phosphonium salts.

2. The method of claim 1, wherein the second resin is a phenolic polyvinyl acetal resin.

3. The method of claim 1, wherein the second ink receptive layer further comprises thermally inert organic polymer particles that are present in an amount of at least 0.1 weight % and up to and including 5 weight %, based on the total dry weight of the second ink receptive layer, which thermally inert organic polymer particles have an average particle size in μm that is at least 1.5 times average dry coating weight of the second ink receptive layer in g/m².

4. The method of claim 1, wherein the positive-working lithographic printing plate precursor further comprises:
   a poly(vinyl phosphonic acid) interlayer, optionally comprising phosphoric acid or a salt thereof comprising aluminum cation, disposed directly on the grained and anodized aluminum-containing substrate.

5. The method of claim 4, wherein the poly(vinyl phosphonic acid) interlayer has been derived by treating the grained and anodized aluminum-containing substrate with a solution comprising poly(vinyl phosphonic acid) and phosphoric acid.

6. The method of claim 1, wherein the infrared radiation absorber is present only in the second ink receptive layer.

7. The method of claim 1, wherein the second ink receptive layer further comprises a third water-insoluble, alkali-soluble or -dispersable resin that comprises a polysiloxane unit segment in a polyurethane or polyurethane urea backbone or side chain.

8. The method of claim 1, wherein the processing solution comprises at least 0.0001 gram-atom/kg of a metal cation $M^{2+}$ selected from the group consisting of barium, calcium, strontium, and zinc cations.

9. The method of claim 8, wherein the metal cation $M^{2+}$ is present in the processing solution in an amount of at least 0.001 and up to and including 0.01 gram-atom/kg.

10. The method of claim 8, wherein the processing solution further comprising a chelating agent that has a complex formation constant (log K) for the barium, calcium, strontium, or zinc $M^{2+}$ metal cation of at least 3.5 and less than or equal to 4.5, and a complex formation constant (log K) for aluminum ion of 7 or less.

11. The method of claim 8, wherein the processing solution further comprises a chelating agent that is a phosphono-polycarboxylic acid.

12. The method of claim 1, wherein the processing solution comprises 2-phosphonobutane-1,2,4-tricarboxylic acid.

13. The method of claim 1, wherein the processing solution comprises an alkali metal hydroxide as an alkali agent.

14. The method of claim 1, wherein the processing solution comprises a cationic surfactant.

15. The method of claim 1, wherein the processing solution has a pH of at least 12.5 and up to and including 14, calcium or strontium metal cations, a sodium or potassium hydroxide, 2-phosphonobutane-1,2,4-tricarboxylic acid, and a cationic surfactant.

16. The method of claim 1, further comprising baking the lithographic printing plate after the processing.

17. The method of claim 7, wherein the third water-insoluble, alkali-soluble or -dispersible resin further comprises a substituent having an acidic hydrogen atom.

18. The method of claim 1, wherein the first ink receptive layer comprise water-insoluble, alkali solution-soluble or -dispersible first resin that comprises recurring units comprising pendant tetrazole groups or recurring units derived from an alkoxymethyl (meth)acrylamide.

* * * * *